United States Patent
Yukawa

(10) Patent No.: US 6,581,016 B1
(45) Date of Patent: Jun. 17, 2003

(54) APPARATUS FOR ACCURATELY MEASURING IMPEDANCE AND METHOD USED THEREIN

(75) Inventor: Akira Yukawa, Tokyo (JP)

(73) Assignee: NEC Electronics Corporation, Kanagawa (JP)

(*) Notice: Subject to any disclaimer, the term of this patent is extended or adjusted under 35 U.S.C. 154(b) by 0 days.

(21) Appl. No.: 09/362,011

(22) Filed: Jul. 27, 1999

(30) Foreign Application Priority Data

Jul. 30, 1998 (JP) .......................................... 10-215818

(51) Int. Cl.$^7$ .......................... G01R 25/00; G01R 27/00
(52) U.S. Cl. .......................... 702/65; 702/117; 324/600
(58) Field of Search ........................ 702/57, 58, 64–66, 702/69, 108–112, 116, 117, 118, 120, 124, 126, 127, 183, 185, 189, 191, 195; 324/600, 605, 76.12, 76.52, 76.77, 76.78

(56) References Cited

U.S. PATENT DOCUMENTS

| | | | | |
|---|---|---|---|---|
| 3,718,856 A | * | 2/1973 | Hendriks | 324/650 |
| 3,984,768 A | * | 10/1976 | Staples | 324/378 |
| 4,307,267 A | * | 12/1981 | Peoples | 324/605 |
| 4,342,089 A | * | 7/1982 | Hall | 324/608 |
| 4,404,636 A | * | 9/1983 | Campbell et al. | 324/650 |
| 4,947,130 A | * | 8/1990 | Kitayoshi | 324/603 |
| 5,225,756 A | | 7/1993 | Coutu | 318/696 |
| 5,321,364 A | * | 6/1994 | Nukiyama et al. | 324/601 |
| 5,467,294 A | | 11/1995 | Hu et al. | 708/276 |
| 5,886,529 A | * | 3/1999 | Wakamatsu | 324/130 |

FOREIGN PATENT DOCUMENTS

| | | |
|---|---|---|
| EP | 0 271 849 | 6/1988 |
| EP | 0 417 708 A2 | 3/1991 |
| JP | 61-266965 | 11/1986 |
| JP | H4-31773 | 2/1992 |
| JP | 4-31773 | 2/1992 |

* cited by examiner

Primary Examiner—Marc S. Hoff
Assistant Examiner—Manuel L. Barbee
(74) Attorney, Agent, or Firm—Scully, Scott, Murphy & Presser

(57) ABSTRACT

An apparatus for measuring an impedance produces an alternating current from digital codes representative of a sine wave, and converts an ac voltage due to an alternating current flowing into an object to a digital signal; a multiplier successively multiplies the binary values of the digital signal by the binary values of the digital codes representing the sine wave and a cosine wave, an accumulator successively adds the products, and a microcomputer calculates the impedance of the object on the basis of the sums of products, thereby improving the accuracy of the calculating result.

21 Claims, 6 Drawing Sheets

APPARATUS FOR ACCURATELY MEASURING IMPEDANCE AND METHOD USED THEREIN

FIELD OF THE INVENTION

This invention relates to a measurement of impedance and, more particularly, to an apparatus for measuring impedance and a method used therein.

DESCRIPTION OF THE RELATED ART

In the following description, term "impedance" means an absolute value of the impedance of an electric circuit, a value of the real part, a value of the imaginary part and a ratio therebetween. A typical example of the apparatus for measuring impedance is disclosed in Japanese Patent Publication of Unexamined Application No. 61-266965. FIG. 1 illustrates the prior art apparatus for measuring impedance. Although the references are different, FIG. 1 is corresponding to FIG. 1 disclosed in the Japanese Patent Publication of Unexamined Application.

The prior art apparatus measures the impedance of a target circuit 100. The target circuit 100 is assumed to be a capacitive element, and has an admittance Y expressed as Y=G+jB where G is a conductance and B is susceptance. The prior art apparatus comprises a source of alternating current 102, a current-to-voltage converter 103, a phase discriminator 104, a phase shifter 105, a phase discriminator 106, a comparator 107, a switching unit 108 and an analog-to-digital converter 110. The source of alternating current 102 applies a voltage e to the target circuit, and a current ig flows out from the target circuit 100 into the current-to-voltage converter 103. The amount of current is expressed as e(G+jB). The current-to-voltage converter 103 converts the current ig to an output voltage ey, and the output voltage ey is equal to −R×ig. The output voltage ey is applied to the phase discriminators 104 and 106.

The phase discriminator 104 multiplies the voltage ey by the output voltage e of the source of alternating current 102, and extracts the direct current component. The phase discriminator 104 outputs a dc voltage ea proportional to the conductance G. On the other hand, the other phase discriminator 106 multiplies the voltage ey by the output voltage of the phase shifter 105. The phase shifter 105 is supplied with the voltage e of the source of alternating current 102, and introduces a phase lag of 90 degrees between the voltage e and the output voltage. For this reason, the phase discriminator 106 outputs a dc voltage eb proportional to the susceptance B.

The switching unit 108 has two input nodes 109a and 109b. The dc voltage ea is applied to the input terminal 109a, and the other dc voltage eb is applied to the other input terminal 109b. The switching unit 108 selectively supplies the dc voltages ea and eb to the analog-to-digital converter 110, and the analog-to-digital converter 110 converts the dc voltages ea/eb to a digital signal.

The prior art measuring apparatus further comprises a microcomputer 111, an ac voltage-to-dc voltage converter 112, an analog-to-digital converter 113 and display units 114a/114b. The output voltage ey is supplied to the ac voltage-to-dc voltage converter 112, and the ac voltage-to-dc voltage converter 112 produces a dc voltage from the output voltage ey. The dc voltage is proportional to absolute value of the admittance Y. The dc voltage is supplied to the analog-to-digital converter 113, and is converted to a digital signal.

The analog-to-digital converters 110 and 113 are connected to the microcomputer 111. The microcomputer 111 calculates the conductance G and the susceptance B on the basis of the digital signal supplied from the analog-to-digital converter 110, and the displays 114a/114b indicate the conductance G, the susceptance B, respectively. The microcomputer calculates the absolute value of the admittance on the basis of the digital signal supplied from the analog-to-digital converter 113.

The comparator 107 behaves as follows. The dc voltage ea is compared with the dc voltage eb. If the admittance Y is much greater than the conductance G, i.e., Y>>G, the susceptance B is expressed as $$B=\sqrt{(Y^2-G^2)}\approx Y$$

For this reason, the microcomputer 111 ignores the digital signal converted from the dc voltage eb, and calculates the susceptance B on the basis of the digital signal supplied from the analog-to-digital converter 113.

On the other hand, when the admittance Y is much greater than the susceptance B, i.e., Y>>B, the conductance G is expressed as $$G=\sqrt{(Y^2-B^2)}\approx Y$$

For this reason, the microcomputer 111 ignores the digital signal converted from the dc voltage ea, and calculates the conductance G on the basis of the digital signal supplied from the analog-to-digital converter 113. This is because of the fact that the ac voltage-to-dc voltage converter 112 is much higher in accuracy than the phase discriminators 104/106. In fact, the error introduced by the phase discriminators 104/106 is of the order of 0.1 to 0.2 percent. On the other hand, the error introduced by the ac voltage-to-dc voltage converter 112 is of the order of 0.01 percent. Thus, the microcomputer 111 gives the priority to the digital signal supplied from the ac voltage-to-dc voltage converter 112 through the analog-to-digital converter 113, and enhances the accuracy.

The Japanese Patent Publication of Unexamined Application further discloses an apparatus for measuring an impedance of an inductive element. The resistance R, the reactance X and the impedance Z are measured in a similar manner to that described hereinbefore. The microcomputer also gives the priority to the digital signal converted from the dc voltage representative of the impedance Z, and calculates the resistance R or the reactance X on the basis of the digital signal under the condition of Z>>X or Z>>R.

Although the priority given to the ac voltage-to-dc voltage converter 112 fairly improves the accuracy of the measurement, i.e., either conductance or susceptance under the conditions of Y>>G or Y>>B, the measurement still contains the susceptance or the conductance calculated on the basis the digital signal converted from the dc voltage eb or ea. When the admittance Y is not much greater than the conductance G and the susceptance B, both of the conductance G and the susceptance B are calculated on the basis of the digital signals converted from the dc voltages ea and eb. Thus, the prior art apparatus still has a problem in the accuracy of the measurement. This is the first problem inherent in the prior art apparatus.

The second problem is a noise component due to the dc offset voltage in the phase discriminators 104/106. The prior art apparatus is connected to various kinds of electric circuits 105, and the phase discriminators 104 and 106 require a dc amplification for the dynamic range. The dc voltages ea and eb contain the dc offset voltage, and the dc offset voltage is transferred to the digital signal through the analog-to-digital conversion. Thus, the digital signal contains the noise component, and the noise component deteriorates the measurement. This is the second problem inherent in the prior art apparatus.

The third problem is the phase shifter 105. Although the phase shifter 105 targets the phase lag for 90 degrees, the phase shifter can not shift the output voltage e by 90 degrees at all times. This means that the analog multiplication is not accurate.

The same problems are encountered in the prior art apparatus used for an inductive element.

SUMMARY OF THE INVENTION

It is therefore an important object of the present invention to provide an apparatus for accurately measuring an impedance.

It is also an important object of the present invention to provide a method for accurately measuring an impedance.

To accomplish the object, the present invention proposes to digitize a signal processing for determining an impedance.

In accordance with one aspect of the present invention, there is provided an apparatus for measuring an impedance of an object comprising a port connected to the object, a periodic signal generator connected to the port and supplying a first analog signal periodically varied and produced from a first digital signal through the port to the object for generating a second analog signal varied due to the impedance, a digital signal generator producing a second digital signal from the second analog signal and a data processor connected to the periodic signal generator and the digital signal generator and supplied with the first digital signal and the second digital signal for determining the impedance.

In accordance with another aspect of the present invention, there is provided a method for measuring an impedance of an object comprising the steps of a) generating a first analog signal from a first digital signal, b) supplying the first analog signal to the object for producing a second analog signal varied due to the impedance, c) converting the second analog signal to a second digital signal and d) determining the impedance through a digital processing on the first digital signal and the second digital signal.

BRIEF DESCRIPTION OF THE DRAWINGS

The features and advantages of the measuring apparatus and the method will be more clearly understood from the following description taken in conjunction with the accompanying drawings in which.

DESCRIPTION OF THE PREFERRED EMBODIMENTS

First Embodiment

Figure 2:
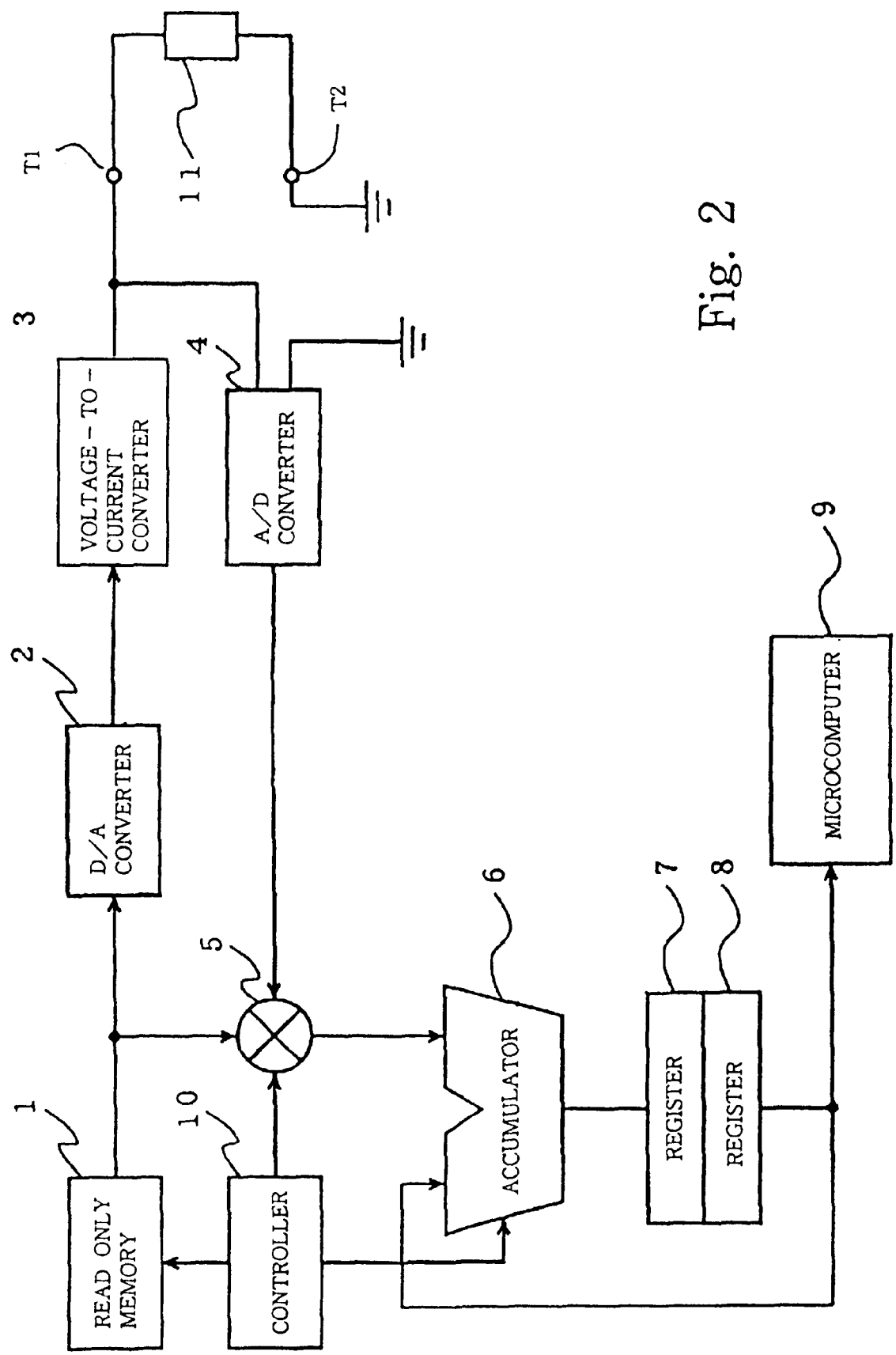
FIG. 2 is a block diagram showing the circuit configuration of a measuring apparatus according to the present invention.

Referring to FIG. 2 of the drawings, a measuring apparatus embodying the present invention comprises a read only memory 1, a digital-to-analog converter 2, a voltage-to-current converter 3, an analog-to-digital converter 4, a multiplier 5, an accumulator 6, registers 7 and 8, a microcomputer 9 and a controller 10. An object 11 is connected between the measuring apparatus and the ground, and the impedance of the object 11 is to be measured.

The read only memory 1 stores discrete values representative of a quarter of a sine wave, and the discrete values are stored in terms of time. The sine wave has an angular frequency $\omega 0$. The discrete values are repeatedly read out from the read only memory 1, and are supplied to the voltage-to-current converter 3 through the digital-to-analog converter 2. An alternating current is generated from the discrete values, and the alternating current flows into the object 11. The alternating current is converted to ac voltage, and the analog-to-digital converter 4 digitizes the ac voltage. The microcomputer 9 calculates the impedance of the object 11 at the angular frequency $\omega 0$ on the basis of the digital data signal representative of the ac voltage and the discrete values.

The controller 10 supervises the read only memory 1, the multiplier 5 and the accumulator 6. In detail, the controller 10 reads out the discrete values from the read only memory 1. As described hereinbefore, the discrete values represent the quarter of the sine wave, and the controller 10 sequentially addresses the memory locations as follows. First, the controller 10 sequentially reads out the discrete values in regular order, and, thereafter, reversely reads out them. Subsequently, the controller 10 instructs the read only memory 1 to invert the polarity of the discrete values, and reads out the discrete values in the regular order. Finally, the controller 10 reversely reads out the discrete values inverted in polarity. Then, the sine wave is generated from the discrete values.

A cosine wave is further generated from the discrete values. The controller 10 repeats the generation of the sine wave and the generation of the cosine wave in a time sharing fashion. First, the controller 10 reversely reads out the discrete values. The controller 10 instructs the read only memory 1 to invert the polarity of the discrete values, and reads out the discrete values inverted in polarity in the regular order. Subsequently, the controller 10 reversely reads out the discrete values inverted in polarity. Finally, the controller 10 reads out the discrete values in the regular order without inversion in polarity. The cosine wave is different in phase from the sine wave by 90 degrees.

Figure 1:
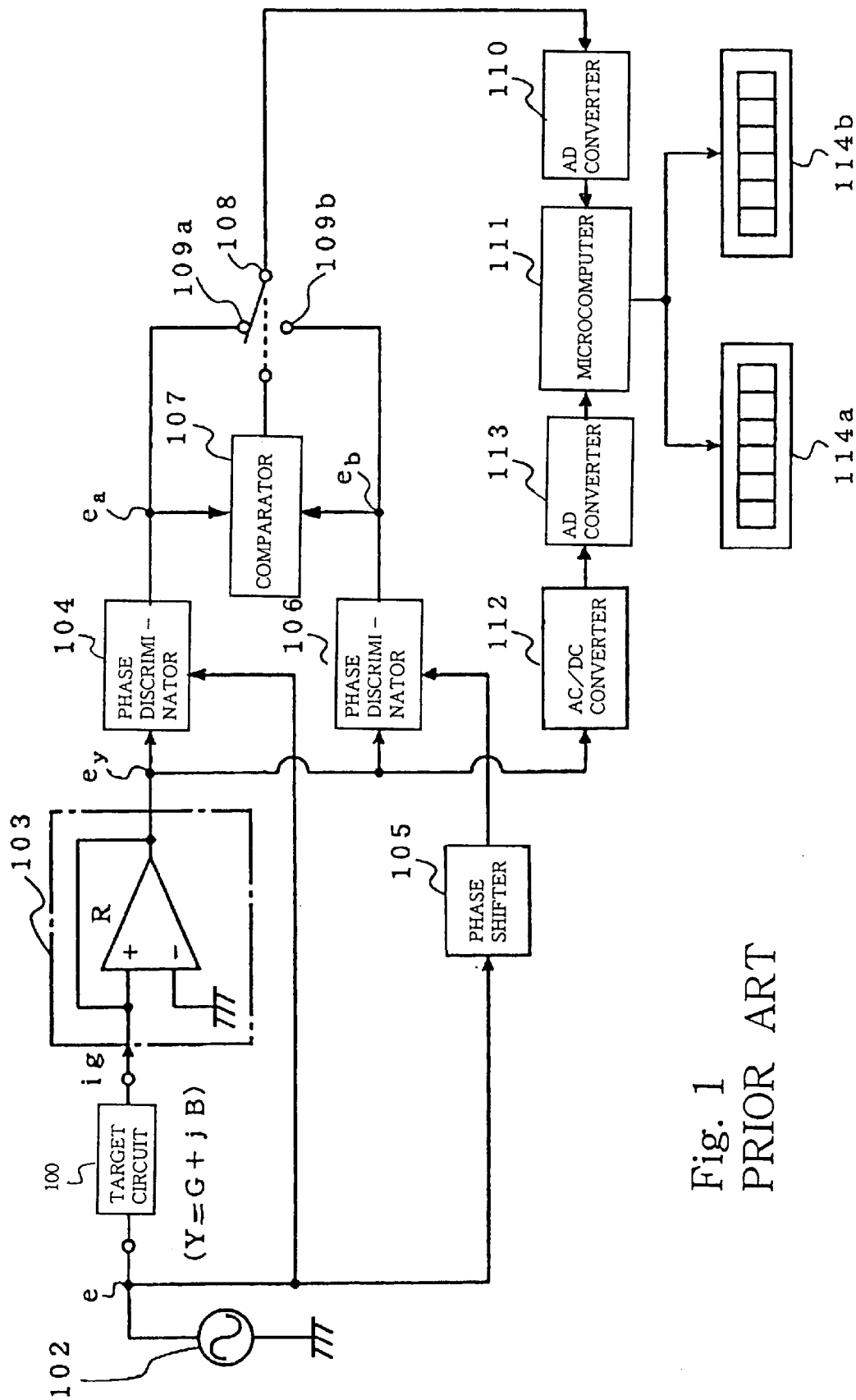
FIG. 1 is a block diagram showing the circuit configuration of the prior art measuring apparatus disclosed in Japanese Patent Publication of Unexamined Application No. 61-266965.

The digital-to-analog converter 2 converts the series of discrete values representative of the sine wave or the cosine wave to an analog signal. The analog signal varies the voltage level, and is supplied to the voltage-to-current converter 3. The voltage-to-current converter 3 produces the alternating current from the analog voltage signal, and supplies it to the object 11. The voltage-to-current converter 3 may be implemented by an operational amplifier shown in FIG. 1.

When the alternating current flows into the object 11, the amount of alternating current is multiplied by the impedance of the object 11. The product is represented by the ac voltage. The ac voltage is representative of the sine wave and the cosine wave in the time sharing fashion. The ac voltage is supplied to the analog-to-digital converter 4, and is converted to the digital signal. The digital signal is supplied to the multiplier 5.

The multiplier 5 multiplies the digital signal by the discrete value representative of a part of the sine wave. The multiplier 5 further multiplies the digital signal by the discrete value representative of a part of cosine wave. Although the discrete values stored in the read only memory 1 represents the quarter of the sine wave having the angular frequency $\omega 0$ only. However, the signal processing from the digital-to-analog conversion to the analog-to-digital conversion introduces the quantizing noise and external noises into the digital signal. For this reason, the digital signal represents a sine wave of a cosine wave both having various angular frequencies $\omega$ together with the angular frequency $\omega 0$. However, description is firstly made on the principle of the measurement according to the present invention on the assumption that the digital signal represents the sine wave and the cosine wave at the angular frequency $\omega 0$ without consideration of differences between direct current and alternating current.

Assuming now that the sine wave sin $\omega 0t$ represents the alternating current, the impedance of the object 11 affects the alternating current, and the response functions are the sine wave sin $\omega 0t$ due to the real part of the impedance and the cosine wave cos $\omega 0t$ due to the imaginary part of the impedance. As described hereinbefore, the multiplier 5 multiplies the digital signal by the discrete values representing the sine wave sin $\omega 0t$ and the cosine wave cos $\omega 0t$ at different timings. When the multiplier 5 multiplies the values on the sine wave sin $\omega 0$ and the values on the cosine wave cos $\omega 0$ by the discrete values representing the sine wave sin $\omega 0t$, the real part of the impedance causes the product to contain $\sin^2 \omega 0t = \frac{1}{2}(1-\cos 2\omega 0t)$, and the imaginary part of the impedance causes the product to contain sin $\omega 0t \times \cos \omega 0t = \frac{1}{2} \sin 2\omega 0t$. The alternating current components cos $2\omega 0$ and sin $2\omega 0t$ are subtracted from the product, a digital signal representing the difference has a value proportional to the real part.

On the other hand, when the multiplier 5 multiplies the values on the sine wave sin $\omega 0$ and the values on the cosine wave cos $\omega 0$ by the discrete values representing the cosine wave cos $\omega 0t$, the real part of the impedance causes the product to contain cos $\omega 0t \times \sin \omega 0t = \frac{1}{2} \sin 2 \omega 0t$, and the imaginary part of the impedance causes the product to contain cos $\omega 0t \times \cos \omega 0t = \frac{1}{2}(1+\cos 2\omega 0t)$. After the elimination of the alternating current components, the digital signal is proportional to the imaginary part of the impedance.

The accumulator 6 eliminates the alternating current components from the digital signal representative of the products. The accumulator 6 successively adds the products over plural periods. If the digital signal supplied from the analog-to-digital converter 4 does not contain the quantizing noise and the external noises, the alternating current components are sin $2\omega 0t$ and cos $2\omega 0t$ only, and the alternating current components are eliminated from the digital signal through the accumulation over only one period. However, the digital signal supplied to the multiplier 5 unavoidably contains the quantizing noise and the external noises. In order to eliminate those noise components and the alternating current components from the products, the accumulator 6 accumulates the products over a hundred periods or more. The results of the accumulation, a sum of products and another sum of products are separately supplied to the registers 7 and 8, and are stored therein. The registers 7 and 8 are assigned to a sine term and a cosine term, respectively, as will be described hereinlater.

Upon completion of the accumulation, the microcomputer 9 fetches the digital values representative of the sums of products from the registers 7 and 8. The microcomputer 9 brings the sums of products to squares, respectively, and adds the squares to one another. The microcomputer 9 finds the square root of the sum. The square root is proportional to the absolute value of the impedance. The microcomputer 9 determines the ratio of the sum, which is equal to the ratio of the real part to the imaginary part, i.e., the phase angle tan $\theta$.

The digital signal vi supplied to the multiplier 5 is assumed to be expressed as $A\sin(\omega t+\phi)$. When the multiplier 5 carries out the multiplication on the digital values representative of parts of the sine wave and the digital values representative of parts of the cosine wave over n periods, the accumulator 6 stores a sine term $Hs(\omega)$ and a cosine term $Hc(\omega)$ in the registers 7 and 8, respectively. The sine term $Hs(\omega)$ and the cosine term $Hc(\omega)$ are expressed as $$Hs(\omega) = \int_0^{2n\pi/\omega 0} vi\, \sin(\omega 0 t) dt$$

$$Hc(\omega) = \int_0^{2n\pi/\omega 0} vi\, \cos(\omega 0 t) dt]$$

First, the sine term $Hs(\omega)$ is calculated as $$Hs(\omega) = \int_0^{2n\pi/\omega 0} Ai \sin(\omega t + \psi) \sin(\omega 0 t) dt$$
$$= (Ai/2) \int_0^{2n\pi/\omega 0} [\cos\{(\omega - \omega 0)t + \psi\} - \cos\{(\omega + \omega 0)t + \psi\}] dt$$

If $\omega = \omega 0$, the sine term $Hs(\omega)$ is given as $$Hs(\omega) = (Ai/2) \int_0^{2n\pi/\omega 0} \{\cos(\psi) - \cos(2\omega 0 t + \psi)\} dt$$
$$= n\pi Ai \times \cos(\psi)/\omega 0$$

On the other hand, if $\omega \neq \omega 0$, the sine term $Hs(\omega)$ is given as $$Hs(\omega) = (Ai/2)[[\sin\{(\omega - \omega 0)t + \psi\}/(\omega - \omega 0)] -$$
$$[\sin\{(\omega + \omega 0)t + \psi\}/(\omega + \omega 0)]]_0^{2n\pi/\omega 0}$$
$$= (Ai/2)[[\sin\{2n\pi((\omega/\omega 0) - 1) + \psi\} - \sin(\psi)]/(\omega - \omega 0) -$$
$$[\sin\{2n\pi((\omega/\omega 0) + 1) + \psi\} - \sin(\psi)]/(\omega + \omega 0)]]$$
$$= (Ai/2)\{\sin\{2n(\omega/\omega 0)\pi + \psi\} - \sin(\psi)\}\{2\omega 0/(\omega^2 - \omega 0^2)]$$
$$= 2Ai\cos\{n(\omega/\omega 0)\pi + \psi\}\sin\{n(\omega/\omega 0)\pi\}\{\omega 0/(\omega^2 - \omega 0^2)\}$$

The cosine term $Hc(\omega)$ is expressed as $$Hc(\omega) = \int_0^{2n\pi/\omega 0} Ai \sin(\omega t + \psi) \cos(\omega 0 t) dt$$
$$= (Ai/2) \int_0^{2n\pi/\omega 0} [\sin\{(\omega + \omega 0)t + \psi\} + \sin\{(\omega - \omega 0)t + \psi\}] dt$$

If $\omega = \omega 0$, the sine term $Hc(\omega)$ is given as $$Hc(\omega) = (Ai/2) \int_0^{2n\pi/\omega 0} \{\sin(2\omega 0 t + \psi) + \sin(\psi)\} dt$$

-continued $$= n\pi Ai \times \sin(\psi)/\omega 0$$

On the other hand, if $\omega \neq \omega 0$, the cosine term $Hc(\omega)$ is given as $$Hc(\omega) = -(Ai/2)[[\cos\{(\omega+\omega 0)t+\psi\}/(\omega+\omega 0)] +$$
$$[\cos\{(\omega-\omega 0)t+\psi\}/(\omega-\omega 0)]]_0^{2n\pi/\omega 0}$$
$$= -(Ai/2)[[\cos\{2n\pi((\omega/\omega 0)+1)+\psi\}-\cos(\psi)]/(\omega+\omega 0) +$$
$$[\cos\{2n\pi((\omega/\omega 0)-1)+\psi\}-\cos(\psi)]/(\omega-\omega 0)]]$$
$$= -(Ai/2)\{\cos\{2n(\omega/\omega 0)\pi+\psi\} -$$
$$\cos(\psi)\}[\{1/(\omega+\omega 0)\}+\{1/(\omega-\omega 0)\}]$$
$$= 2Ai\sin\{n(\omega/\omega 0)\pi+\psi\}\sin\{n(\omega/\omega 0)\pi\}\{\omega 0/(\omega^2-\omega 0^2)\}$$

If $\omega=\omega 0$, the sum $H(\omega)^2$ of the squares is given as $$H(\omega)^2 = (n^2\pi^2 Ai^2)/\omega 0^2 \qquad \text{equation 1}$$

On the other hand, if $\omega \neq \omega 0$, the sum $H(\omega)^2$ of the squares is given as $$H(\omega)^2 = 4Ai^2\sin^2\{n(\omega/\omega 0)\pi\}[\{\omega 0^2/(\omega^2-\omega 0^2)^2\} \qquad \text{equation 2}$$
$$\cos^2\{n(\omega/\omega 0)\pi+\psi\}+\{\omega^2/(\omega^2-\omega 0^2)^2\}$$
$$\sin^2\{n(\omega/\omega 0)\pi+\psi\}]$$
$$= 4Ai^2\sin^2\{n(\omega/\omega 0)\pi\}[\{\omega 0^2/(\omega^2-\omega 0^2)^2\} +$$
$$[1/(\omega^2-\omega 0^2)\}\sin^2\{n(\omega/\omega 0)\pi+\psi\}]$$

Figure 3:
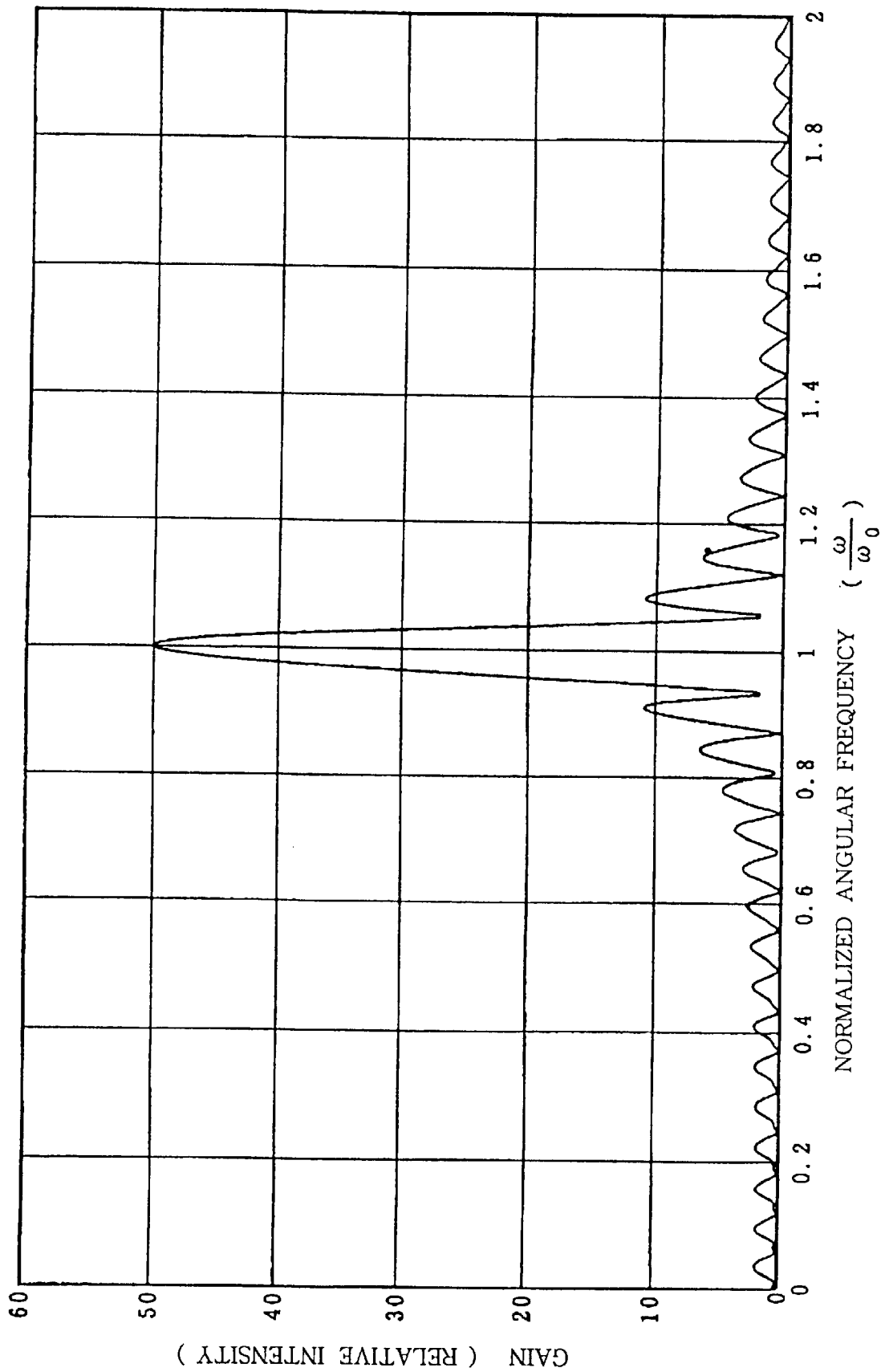
FIG. 3 is a graph showing relation between a normalized angular frequency and a gain.

The present inventor plotted the sum $H(\omega)^2$ in FIG. 3 on the assumption that n is 32. When the angular frequency $\omega$ is spaced from the angular frequency $\omega 0$, the gain is decreased.

In the first embodiment, the read only memory 1, the controller 10, the digital-to-analog converter 2 and the voltage-to-current converter 3 as a whole constitute a periodic signal generator, and the analog-to-digital converter 4 serves as a digital signal generator. The multiplier 5, the controller 10, the accumulator 6, the registers 7 and 8 and the microcomputer 9 as a whole constitute a data processor.

As will be understood from the foregoing description, the measuring apparatus according to the present invention stores the pieces of data information representative of the sine wave in the form of digital codes, and converts the ac voltage to the digital signal. This means that the impedance is determined through the digital signal processing. Only the quantizing noise is introduced into the digital signal supplied from the analog-to-digital converter 4 to the multiplier 5. The discrete values are stored in the form of digital code, and are directly supplied to the multiplier 5. This means that the digital signal is free from a noise component due to the dc offset voltage. When the accumulator 5 accumulates the products for N periods of the sine wave, the improvement of resolution is given as ½ $\log_2$ N. If N is 256, the resolution is improved by 4 bits. Thus, the digital signal processing is more accurate rather than the analog signal processing, and the measuring apparatus achieves a resolution higher than the prior art.

Moreover, the accumulator 6 extracts the dc components like a digital filter after the multiplication. This means that any low-pass filter is required for the elimination of the alternating current components. A condenser is incorporated in the low-pass filter, and the low-pass filter is undesirable for an integrated circuit. Any condenser is not incorporated in the accumulator 6, and the manufacturer easily integrates the components 1 to 10 on a semiconductor chip.

Second Embodiment

Figure 4:
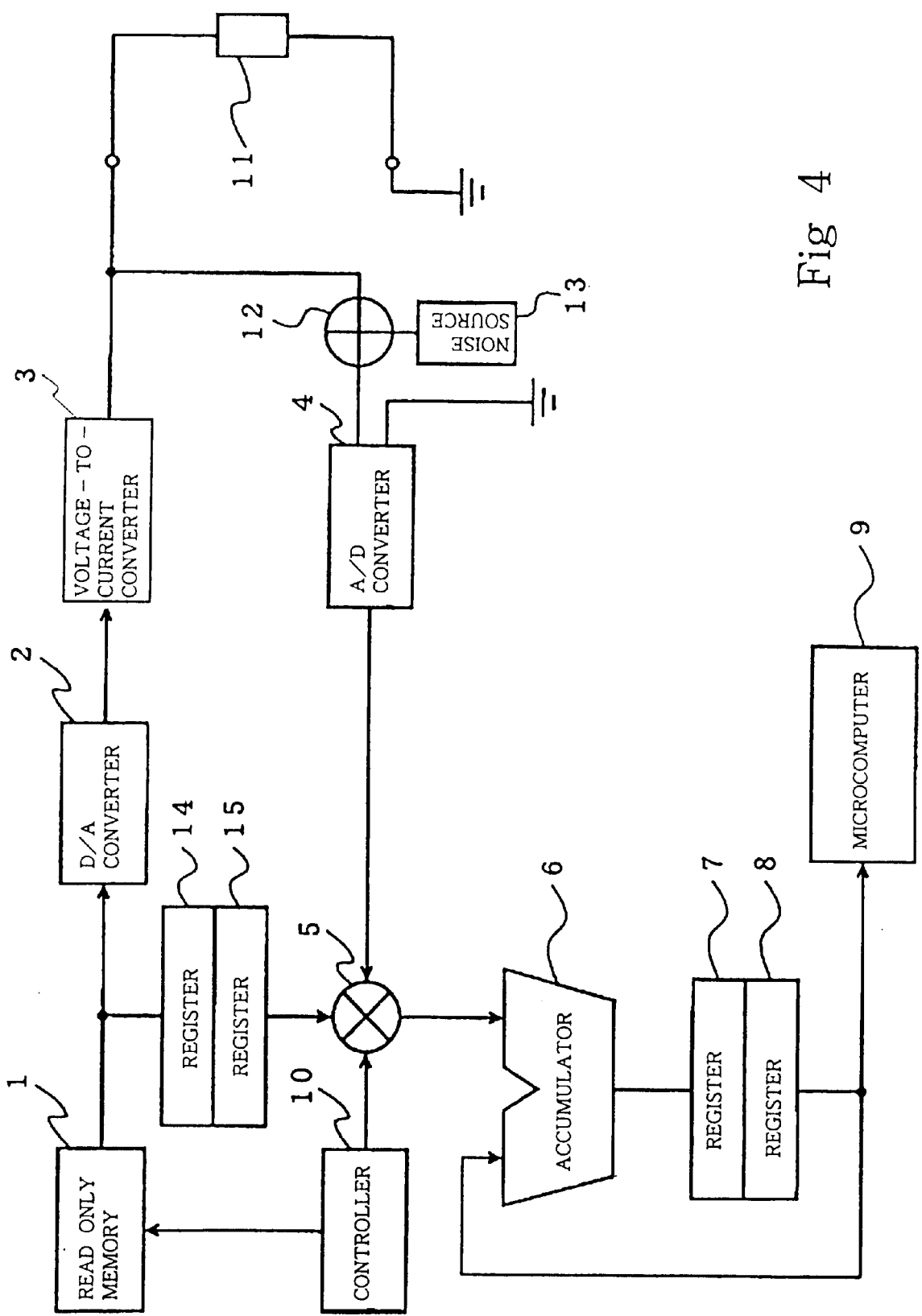
FIG. 4 is a block diagram showing the circuit configuration of another measuring apparatus according to the present invention.

FIG. 4 illustrates another apparatus embodying the present invention. A mixer 12, a noise source 13 and registers 14 and 15 are added to the measuring apparatus implementing the first embodiment, and the other components are corresponding to the components of the first embodiment. For this reason, the other components are labeled with references designating the corresponding components without detailed description. The register 14 is assigned to the discrete values representative of the sine wave, and the other register 15 is assigned to the discrete values representative of the cosine wave.

As described hereinbefore, the noise components introduced between the digital-to-analog conversion to the analog-to-digital conversion are eliminated from the sine term Hs($\omega$) and the cosine term H($\omega$) through the accumulation of the products. However, while the controller 10 is regularly reading out the discrete values from the read only memory 1, the quantizing noise is also regularly mixed into the digital signal supplied to the multiplier 5, and is hardly eliminated from the sine term Hs($\omega$) and the cosine term H($\omega$) through the accumulation of the products. The noise source 13 irregularly generates noise components, and the mixer 12 introduces the irregular noise component into the digital signal. The irregular noise component breaks the regularity of the quantizing noise component, and permits the accumulator 6 to eliminate the noise components from the sine term Hs($\omega$) and the cosine term H($\omega$).

The registers 14 and 15 temporarily store the discrete value representative of a part of the sine wave and the discrete value representative of a part of the cosine wave, and supplies them to the multiplier 5. The registers 14 and 15 make the control for the multiplication simple. Of course, the measuring apparatus implementing the second embodiment also achieves the advantages described in connection with the first embodiment.

In the second embodiment, the read only memory 1, the controller 10, the digital-to-analog converter 2 and the voltage-to-current converter 3 as a whole constitute a periodic signal generator, and the analog-to-digital converter 4, the noise source 13 and the mixer 12 form in combination a digital signal generator. The multiplier 5, the controller 10, the accumulator 6, the registers 7, 8, 14 and 15 and the microcomputer 9 as a whole constitute a data processor.

Third Embodiment

Figure 5:
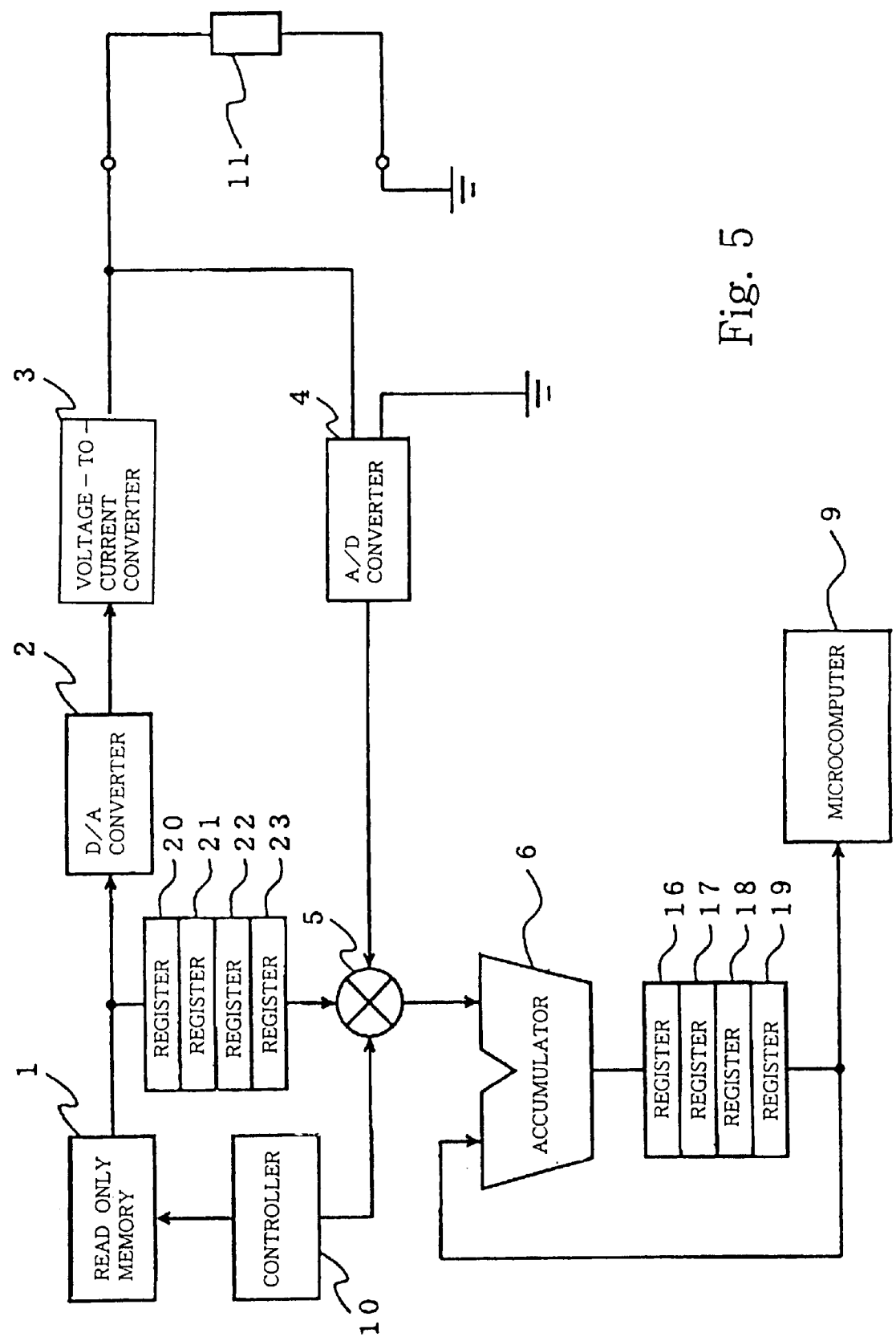
FIG. 5 is a block diagram showing the circuit configuration of yet another measuring apparatus according to the present invention.

FIG. 5 illustrates yet another measuring apparatus embodying the present invention. The registers 7, 8, 14 and 15 are replaced with plural registers 16/18, plural registers 17/19, plural registers 20/22 and plural registers 21/23, respectively. The other components are corresponding to the other components of the second embodiment, and are labeled with the same references without detailed description.

The read only memory 1 stores plural sets of discrete values representative of different sine waves. The plural registers 20 and 22 store discrete values representative of a sine wave at angular frequency f1 and discrete values representative of another sine wave at angular frequency f2. Similarly, the plural registers 21 and 23 store discrete values representative of a cosine wave at angular frequency f1 and discrete values representative of another cosine wave at angular frequency f2. On the other hand, the plural registers 16 and 18 store the sine term Hs($\omega$) at the angular frequency f1 and the sine term Hs(ω) at the angular frequency f2, and the plural registers 17 and 19 store the cosine term Hc(ω) at the angular frequency f1 and the cosine term Hc(ω) at the angular frequency f2. Thus, the apparatus implementing the third embodiment measures the impedance at different frequencies f1 and f2. This feature is desirable, because the impedance takes different values depending upon the angular frequency. Using the measuring apparatus implementing the third embodiment, user measures the impedance at different angular frequencies f1 and f2. The measuring apparatus implementing the third embodiment achieves all the advantages described in connection with the first embodiment.

Fourth Embodiment

Figure 6:
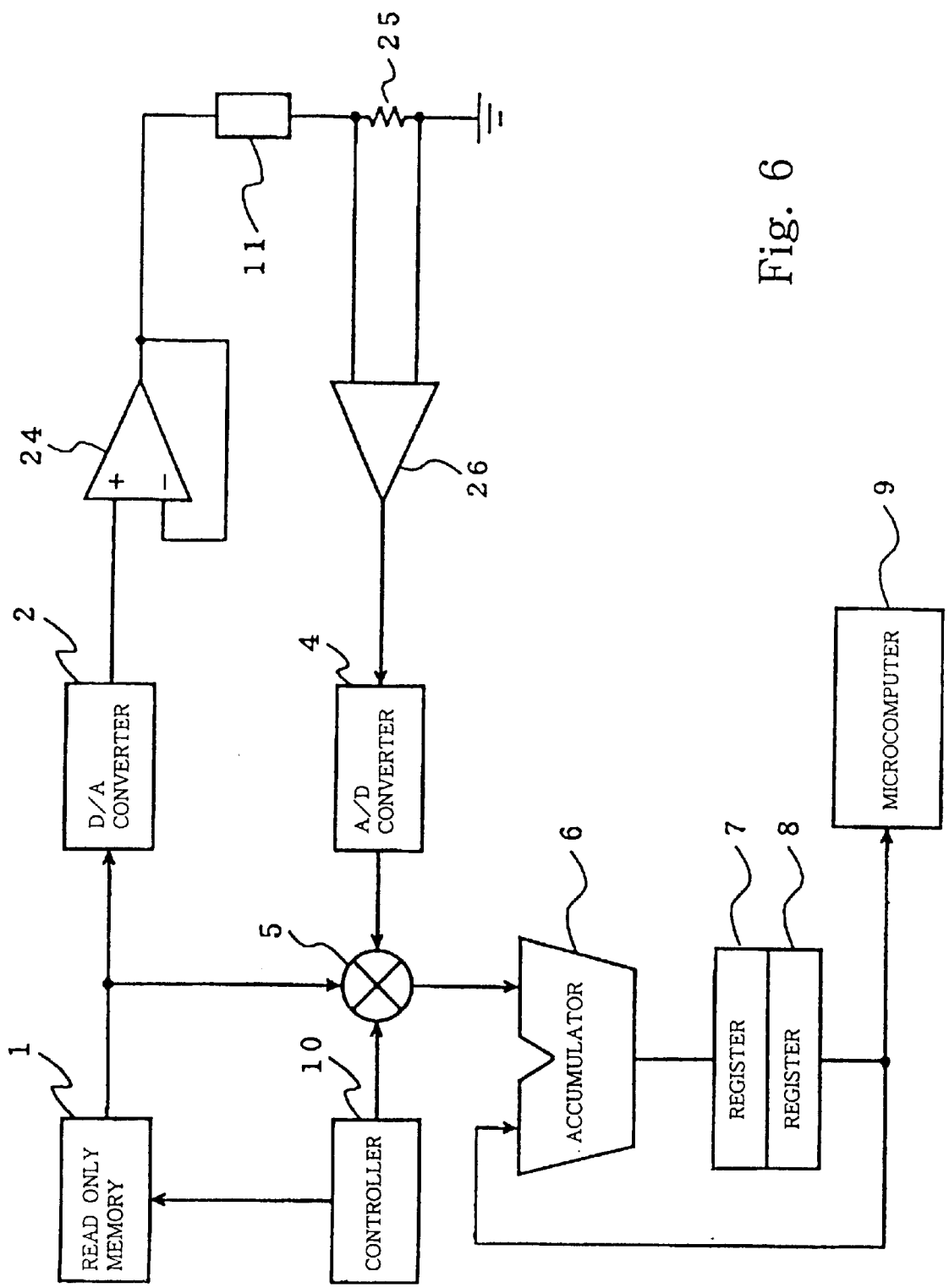
FIG. 6 is a block diagram showing the circuit configuration of still another measuring apparatus according to the present invention.

FIG. 6 illustrates still another measuring apparatus embodying the present invention. The voltage-to-current converter 3 is replaced with a voltage follower 24. A resistor 25 and an ac amplifier 26 are added to the circuit configuration. The resistor 25 has resistance much smaller than the absolute value of the impedance of the object 11. The resistor 25 is connected between the object 11 and the ground, and the two input nodes of the ac amplifier 26 are connected to both ends of the resistor 25, respectively. In the first, second and third embodiments, the alternating current is supplied from the voltage-to-current converter 3 to the object 11, and is converted to the ac voltage. However, the present invention is never limited to the ac current. In the fourth embodiment, the voltage follower 24 applies an ac voltage to the object 11. The resistor 25 generates an extremely small voltage drop, and the extremely small voltage drop is amplified by the ac amplifier 26. The other features are similar to the first embodiment, and no further description is incorporated hereinbelow. The measuring apparatus implementing the fourth embodiment achieves all the advantages described in connection with the first embodiment.

In the fourth embodiment, the read only memory 1, the controller 10, the digital-to-analog converter 2 and the voltage follower 24 as a whole constitute a periodic signal generator. The resistor 25, the ac amplifier 26 and the analog-to-digital converter 4 form in combination a digital signal generator. The multiplier 5, the controller 10, the accumulator 6, the registers 7 and 8 and the microcomputer 9 as a whole constitute a data processor.

Method

The measuring apparatus measures the impedance through the following method. The method is described with reference to FIG. 2. The read only memory 1 stores the discrete values representative of a quarter of the sine wave. The discrete values are stored in the form of digital code, and are plotted on the quarter of the sine wave at predetermined time intervals. The controller 10 stores a pieces of control data representative of the predetermined time intervals and another piece of control data representative of predetermined periods for the accumulation.

The object 11 is connected between terminals T1 and T2 of the measuring apparatus. The measuring apparatus is energized. Then, the controller 10 reads out the discrete values at the predetermined time intervals, and the discrete values are supplied from the read only memory 1 to the digital-to-analog converter 2. The digital-to-analog converter 2 supplies the analog signal to the voltage-to-current converter 3, and the voltage-to-current converter 3 flows the alternating current into the object 11. As a result, the ac voltage takes place at the terminal T1, and is supplied to the analog-to-digital converter 4. The analog-to-digital converter 4 supplies the digital signal to the multiplier 5. The digital signals are multiplied by the discrete values representative of parts of the sine wave, and are successively added by the accumulator 6 over the predetermined periods. The sum is representative of the sine term Hs(ω), and is stored in the register 7. Moreover, the digital signals are multiplied by the discrete values representative of parts of the cosine wave, and are successively added by the accumulator 6 over the predetermined periods. The sum is representative of the cosine term Hc(ω), and is stored in the register 8.

Finally, the microcomputer 9 carries out the calculations on the sine term Hs(ω) and the cosine term Hc(ω), and determines the absolute value of the impedance, the value of the real part, the value of the imaginary part and the ratio between the real part and the imaginary part.

As will be appreciated from the foregoing description, the measuring apparatus carries out the digital data processing for determining the values of the impedance, and improves the resolution of the measurement and the accuracy of the values.

Although particular embodiments of the present invention have been shown and described, it will be apparent to those skilled in the art that various changes and modifications may be made without departing from the spirit and scope of the present invention.

For example, the read only memory may store discrete values representative of a part of cosine wave. In this instance, the controller 10 generates a sine wave together with the cosine wave.

A display or an indicator may be connected to the microcomputer 9 so as to show the impedance.

What is claimed is:

1. An apparatus for measuring an impedance of an object, comprising:

a port connected to said object;

a periodic signal generator connected to said port, and supplying a first analog signal periodically varied and produced from a first digital signal through said port to said object for generating a second analog signal varied due to said impedance;

a digital signal generator producing a second digital signal from said second analog signal; and a data processor connected to said periodic signal generator and said digital signal generator, and supplied with said first digital signal and said second digital signal for determining said impedance through multiplication between said first digital signal and said second digital signal.

2. The apparatus as set forth in claim 1, in which said first digital signal represents a series of discrete values on a first periodic wave and another series of discrete values on a second periodic wave different in phase by 90 degrees from said first periodic wave.

3. The apparatus as set forth in claim 2, in which said first periodic wave and said second periodic wave are a sine wave and a cosine wave, respectively.

4. The apparatus as set forth in claim 2, in which said periodic signal generator includes a memory for storing digital codes representative of a part of said series of discrete values, a controller repeatedly connected to said memory and reading out said part of said series of discrete values in different orders in a time sharing fashion for producing said first digital signal, and a digital-to-analog converter connected between said memory and said port for producing an alternating current serving as said first analog signal.

5. The apparatus as set forth in claim 4, in which said part of said series of discrete value is on a quarter of said first periodic wave, and said controller reads out said part of said series of discrete value from one end toward the other end from said other end of said one end, from said one end toward said other end after an inversion of a polarity of said discrete values and from said other end to said one end under said inversion of said polarity.

6. The apparatus as set forth in claim 2, in which said periodic signal generator includes
   a memory storing digital codes representative of a part of said series of discrete values,
   a controller connected to said memory and repeatedly reading out said part of said series of discrete values in different orders in a time sharing fashion for producing said first digital signal,
   a digital-to-analog converter connected between said memory for converting said first digital signal to an analog signal,
   a voltage follower connected between said digital-to-analog converter and said port for producing an alternating current voltage serving as said first analog signal from said analog signal.

7. The apparatus as set forth in claim 6, in which said part of said series of discrete value is on a quarter of said first periodic wave, and said controller reads out said part of said series of discrete value from one end toward the other end, from said other end of said one end, from said one end toward said other end after an inversion of a polarity of said discrete values and from said other end to said one end under said inversion of said polarity.

8. The apparatus as set forth in claim 1, in which said digital signal generator includes an analog-to-digital converter connected between said port and said data processor.

9. The apparatus as set forth in claim 8, in which said digital signal generator further includes
   a noise source for generating a noise signal representative of an irregular noise, and
   a mixer having a first input node connected to said port, a second input node connected to said noise source and an output node connected to said analog-to-digital converter for mixing said second analog signal with said noise signal.

10. The apparatus as set forth in claim 8, in which said port has an output node and an input node connected to said periodic signal generator for supplying an alternating current voltage serving as said first analog signal to said object, and said digital signal generator further includes a resistive element connected between said output node of said object and a constant voltage source for generating a voltage signal varied between both ends thereof, an amplifier having input nodes connected to said both ends, respectively for increasing the magnitude of said voltage signal and an output node connected to said analog-to-digital converter.

11. The apparatus as set forth in claim 1, in which said first digital signal represents a series of discrete values on a first periodic wave and another series of discrete values on a second periodic wave different in phase by 90 degrees from said first periodic wave, and said second digital signal represents a first series of binary values related to a real part of said impedance and a second series of binary values related to an imaginary part of said impedance.

12. The apparatus as set forth claim 11, in which said data processor includes
   a multiplier connected to said periodic signal generator and said digital signal generator for multiplying the first series of binary values and said second series of binary values by said series of discrete values and said another series of discrete values for producing first products and second products,
   an accumulator connected to said multiplier and accumulating said first products and said second products for producing a first sum of products and a second sum of products,
   a first data storage for storing said first sum of products and said second sum of products, and
   a computer connected to said register for determining said impedance on the basis of said first sum of products and said second sum of products.

13. The apparatus as set forth in claim 12, in which said computer brings said first sum of products and said second sum of products to a first square and a second square, respectively, calculates the sum of said first square and said second square, and finds a square root of said sum for determining said impedance.

14. The apparatus as set forth in claim 12, in which said data processor further includes a second data storage for separately storing said series of discrete values and said another series of discrete values.

15. The apparatus as set forth in claim 12, in which said accumulator repeats the accumulation over predetermined periods for eliminating noise components from said first sum of products and said second sum of products.

16. The apparatus as set forth in claim 12, in which said series of discrete values has plural sub-series of discrete values on said first periodic wave at different frequencies, respectively, and said another series of discrete values has plural sub-series of discrete values on said second periodic wave at different frequencies.

17. The apparatus as set forth in claim 16, in which said computer determines plural values of said impedance at said different frequencies.

18. A method for measuring an impedance of an object, comprising the steps of:
   a) generating a first analog signal from a first digital signal;
   b) supplying said first analog signal to said object for producing a second analog signal varied due to said impedance;
   c) converting said second analog signal to a second digital signal; and
   d) determining said impedance through a multiplication between said first digital signal and said second digital signal.

19. The method as set forth in claim 18, in which said step b) includes the sub-steps of
   b-1) supplying said first analog signal to said object for producing a preliminary analog signal varied due to said impedance, and
   b-2) mixing a noise signal representative of an irregular noise with said preliminary analog signal for producing said second analog signal.

20. The method as set forth in claim 19, in which said series of discrete values and said another series of discrete values are on plural periodic waves different in frequency and other periodic waves different in phase from said plural periodic waves at 90 degrees, respectively, and said impedance has different values respectively corresponding to the different frequencies.

21. The method as set forth in claim 18, in which said first digital signal represents a series of discrete values on a first periodic wave and another series of discrete values on a second periodic wave, and said second digital signal represents a first series of binary values related to a real part of said impedance and a second series of binary values related to an imaginary part of said impedance, and said step d) includes the sub-steps of
- d-1) multiplying said first series of binary values and said second series of binary values by said series of discrete values and said another series of discrete values for producing first products and second products,
- d-2) accumulating said first products and said second products so as to obtain a first sum of products and a second sum of products,
- d-3) bringing said first sum of products and said second sum of products to a square and a second square,
- d-4) calculating a sum of said first square and said second square, and
- d-5) finding a square root of said sum representative of an absolute value proportional to said impedance.

* * * * *